(12) United States Patent
Johnston et al.

(10) Patent No.: US 9,190,839 B2
(45) Date of Patent: *Nov. 17, 2015

(54) CIRCUITS AND METHODS FOR LIMITING OPEN CIRCUIT VOLTAGE OF PHOTOVOLTAIC STRINGS

(71) Applicant: SunPower Corporation, San Jose, CA (US)

(72) Inventors: Keith Johnston, Palo Alto, CA (US); Zachary S. Judkins, Berkeley, CA (US)

(73) Assignee: SunPower Corporation, San Jose, CA (US)

( * ) Notice: Subject to any disclaimer, the term of this patent is extended or adjusted under 35 U.S.C. 154(b) by 6 days.

This patent is subject to a terminal disclaimer.

(21) Appl. No.: 14/097,882

(22) Filed: Dec. 5, 2013

(65) Prior Publication Data

US 2014/0153149 A1     Jun. 5, 2014

Related U.S. Application Data

(63) Continuation of application No. 13/335,756, filed on Dec. 22, 2011, now Pat. No. 8,630,077.

(51) Int. Cl.
| | |
|---|---|
| *H02H 9/00* | (2006.01) |
| *H02H 9/04* | (2006.01) |
| *H02H 3/20* | (2006.01) |
| *H01L 31/042* | (2014.01) |
| *H01L 31/044* | (2014.01) |

(52) U.S. Cl.
CPC . *H02H 9/04* (2013.01); *H02H 3/20* (2013.01); *H01L 31/042* (2013.01); *H01L 31/044* (2014.12)

(58) Field of Classification Search
USPC ............................. 361/58, 91, 91.1; 136/244
See application file for complete search history.

(56) References Cited

U.S. PATENT DOCUMENTS

| | | | | |
|---|---|---|---|---|
| 6,331,670 | B2 * | 12/2001 | Takehara et al. | 136/244 |
| 8,102,074 | B2 | 1/2012 | Hadar et al. | |
| 8,630,077 | B2 * | 1/2014 | Johnston et al. | 361/91.1 |
| 2001/0032664 | A1 | 10/2001 | Takehara et al. | |

FOREIGN PATENT DOCUMENTS

| | | |
|---|---|---|
| DE | 20 209 007318 U1 | 8/2009 |
| JP | 61 154083 A | 7/1986 |
| JP | 2000 217248 A | 8/2000 |

OTHER PUBLICATIONS

Extended European Search Report for Application No. 12 86 0586, Apr. 14, 2015, 6 sheets.

* cited by examiner

*Primary Examiner* — Danny Nguyen
(74) *Attorney, Agent, or Firm* — Okamoto & Benedicto LLP

(57) ABSTRACT

A photovoltaic string may include an open circuit voltage limiter that conducts current in one direction to provide a limiter voltage less than an open circuit voltage of the photovoltaic string, and that conducts current in the other direction. One or more open circuit voltage limiters may be connected across the photovoltaic string or across selected groups of solar cells of the photovoltaic string. The limiter voltage may be greater than a maximum power point voltage but less than the open circuit voltage of the photovoltaic string.

13 Claims, 11 Drawing Sheets

US 9,190,839 B2

CIRCUITS AND METHODS FOR LIMITING OPEN CIRCUIT VOLTAGE OF PHOTOVOLTAIC STRINGS

REFERENCE TO RELATED APPLICATION

This application is a continuation of U.S. application Ser. No. 13/335,756, filed on Dec. 22, 2011, which is incorporated herein by reference in its entirety.

TECHNICAL FIELD

Embodiments of the subject matter described herein relate generally to solar cells. More particularly, embodiments of the subject matter relate to photovoltaic strings.

BACKGROUND

A solar cell, which is a well known device for converting solar radiation to electrical energy, may comprise P-type and N-type diffusion regions. Solar radiation impinging on the solar cell creates electrons and holes that migrate to the diffusion regions, thereby creating voltage differentials between the diffusion regions. The diffusion regions are electrically connected to corresponding terminals to allow an external electrical circuit to be connected to and be powered by the solar cell. The positive terminal of the solar cell is electrically connected to the P-type diffusion regions, while the negative terminal of the solar cell is electrically connected to the N-type diffusion regions.

Solar cells may be electrically connected in series to form a photovoltaic string. The photovoltaic string may comprise several solar cells and/or photovoltaic modules, with each photovoltaic module comprising solar cells mounted on the same frame. In a photovoltaic string, the positive terminal of one solar cell is electrically connected to the negative terminal of another solar cell, the positive terminal of the other solar cell is electrically connected to the negative terminal of yet another solar cell, and so on. The output voltage of a photovoltaic string depends on the number of solar cells in the string.

BRIEF SUMMARY

In one embodiment, a photovoltaic string comprises: (a) a plurality of serially connected solar cells; (b) a positive lead and a negative lead on opposite ends of the photovoltaic string, one end of the plurality of serially connected solar cells being connected to the positive lead and an opposite end of the plurality of serially connected solar cells being connected to the negative lead; and (c) an open circuit voltage limiter across the plurality of serially connected solar cells, the open circuit voltage limiter having a positive terminal connected to the negative lead and a negative terminal connected to the positive lead, the open circuit voltage limiter having a limiter voltage less than an open circuit voltage of the photovoltaic string for current flowing through the open circuit voltage limiter in one direction and allows current flow through the open circuit voltage limiter in another direction.

In another embodiment, a photovoltaic string comprises: a plurality of serially connected solar cells and a first open circuit voltage limiter across a first group of solar cells in the plurality of serially connected solar cells, the first open circuit voltage limiter having a first limiter voltage less than a maximum voltage of the first group of solar cells for current flowing through the first open circuit voltage limiter in one direction and having a first positive bypass voltage for current flowing through the first open circuit voltage limiter in another direction. The photovoltaic string may further comprise a second open circuit voltage limiter across a second group of solar cells in the plurality of serially connected solar cells, the second open circuit voltage limiter having a second limiter voltage less than a maximum voltage of the second group of solar cells for current flowing through the second open circuit voltage limiter in one direction and having a second positive bypass voltage for current flowing through the second open circuit voltage limiter in another direction.

In another embodiment, a method of operating a photovoltaic string comprises providing a first open circuit voltage limiter across a first group of serially connected solar cells of the photovoltaic string. A maximum voltage across the first group of serially connected solar cells is limited to a first limiter voltage across the first open circuit voltage limiter for current flowing in a first direction through the first open circuit voltage limiter. Current is allowed to flow through the first open circuit voltage limiter in a second direction opposite the first direction.

These and other features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
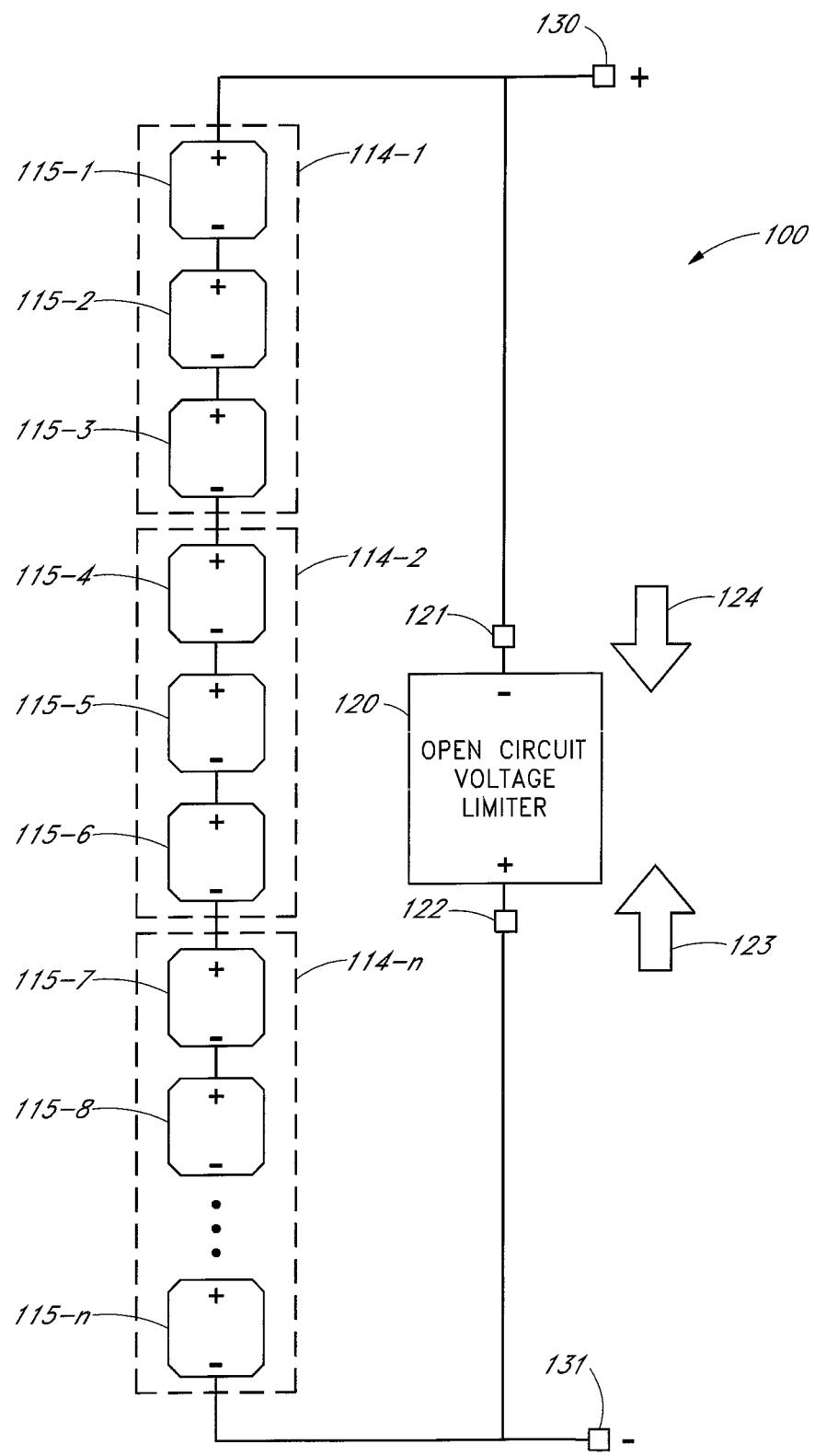
FIG. 1 shows a schematic diagram of a photovoltaic string in accordance with an embodiment of the present invention.

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Photovoltaic strings, which may comprise a plurality of solar cells and/or one or more photovoltaic modules, are characterized by current-voltage (I-V) curves. An I-V curve indicates the amount of output current generated by a photovoltaic string for a given output voltage generated by the photovoltaic string. During normal operation, a photovoltaic string is maintained at the maximum power point (MPP) of the I-V curve, which is the operating point where the photovoltaic string generates maximum output power. The output current of the photovoltaic string at the maximum power point is the maximum power point current Imp, and the output voltage of the photovoltaic module at the maximum power point is the maximum power point voltage Vmp.

At voltages higher than the maximum power point voltage Vmp, the output power of the photovoltaic string decreases rapidly and reaches zero at the open-circuit voltage Voc. The open circuit voltage Voc is the maximum possible output voltage that can be generated by the photovoltaic string. The region between the voltage Vmp and the voltage Voc is rarely used during normal operation, but electrical characteristics of the photovoltaic string in this region have major impact on system design specifications. In particular, the electrical components of a photovoltaic system (e.g., photovoltaic inverter, disconnects, cables, junction boxes) must be rated to the maximum possible output voltage, which is the open circuit voltage Voc. This means that the open circuit voltage Voc dictates the number of solar cells that can be incorporated in a photovoltaic string of a specified voltage (e.g., 1000V).

As a particular example, the voltage Vmp is typically around 20% lower than the open circuit voltage Voc. Therefore, if a photovoltaic string is specified at 1000V, the photovoltaic string typically operates at around 800V. However, there are certain instances where the photovoltaic string is forced to output the open circuit voltage Voc, such as when the photovoltaic inverter's MPP tracker (MPPT) is offline or before it turns on in the morning. This necessitates a photovoltaic string sizing specification based on the open circuit voltage Voc even though it results in suboptimal photovoltaic string sizing and design. As will be more apparent below, embodiments of the present invention allow for reduction of the open circuit voltage Voc without impacting the voltage Vmp. This advantageously allows for increasing the number of solar cells in a photovoltaic string, and therefore reduces the number of photovoltaic strings in a photovoltaic system while keeping total power output constant. Reducing the number of photovoltaic strings allows for reduction of balance-of-system (BOS) costs, such as the number of trackers, piers, drives, electrical components, etc., of the photovoltaic system.

Referring now to FIG. 1, there is shown a schematic diagram of a photovoltaic string 100 in accordance with an embodiment of the present invention. In the example of FIG. 1, the photovoltaic string 100 comprises a plurality of solar cells 115 (i.e., 115-1, 115-2, 115-3, . . . , 115-n). The solar cells 115 are electrically serially connected, with a positive terminal of a first solar cell 115 being connected to the negative terminal of a second solar cell 115, the positive terminal of the second solar cell 115 being connected to the negative terminal of a third solar cell 115, and so on. The positive terminal of one end solar cell 115 (e.g., a solar cell 115-1) is connected to a positive output lead 130 and the negative terminal of the other end solar cell 115 (e.g., a solar cell 115-n) is connected to a negative output lead 131. The output leads 130 and 131 may be connected to other photovoltaic strings and other components of a photovoltaic system, such as a photovoltaic 200 shown in FIG. 3, for example.

Groups of solar cells 115 may be mounted on a same frame of a photovoltaic module 114. A photovoltaic module 114 comprises several solar cells 115 but only a few are shown in FIG. 1 for clarity of illustration. For example, a photovoltaic module 114-1 may comprise the solar cells 115-1 to 115-3, a photovoltaic module 114-2 may comprise the solar cells 115-4 to 115-6, a photovoltaic module 114-n may comprise the solar cells 115-7 to 115-n, and so on. In that example, the photovoltaic string 100 may also be thought of as comprising a plurality of electrically serially connected photovoltaic modules 114, with the positive terminal of one photovoltaic module 114 being connected to the negative terminal of another photovoltaic module 114, and so on. The positive terminal of one end photovoltaic module 114 (e.g., the photovoltaic module 114-1) is connected to the positive output lead 130 and the negative terminal of the other end photovoltaic module 114 (e.g., the photovoltaic module 114-n) is connected to the negative output lead 131.

In one embodiment, the photovoltaic string 100 includes an open circuit voltage limiter 120 electrically connected across the photovoltaic string 100. In the example of FIG. 1, the limiter 120 includes a negative terminal 121 connected to the positive output lead 130 of the photovoltaic string 100, and a positive terminal 122 connected to the negative output lead 131 of the photovoltaic string 100.

In one embodiment, the open circuit voltage limiter 120 is configured to limit the open circuit voltage Voc of the photovoltaic string 100 to a limiter voltage Vlimit that is greater than the maximum power point voltage Vmp but less than the open circuit voltage Voc. In other words, $$Vmp > Vlimit > Voc \quad (EQ. 1)$$

The open circuit voltage limiter 120 may comprise an electrical device, component, or circuit that passes current in one direction beyond a specific voltage and that passes current in the other direction beyond a different voltage. In one embodiment, the open circuit voltage limiter 120 exhibits asymmetric diode-like characteristics in both forward and reverse current directions. With the polarity of the open circuit voltage limiter 120 shown in FIG. 1, an arrow 123 shows a forward current direction through the limiter 120, and an arrow 124 shows a reverse current direction through the limiter 120.

In one embodiment, the limiter 120 allows reverse current to flow from the negative terminal 121 to the positive terminal 122 as per the arrow 124 when the voltage across the limiter 120 exceeds the limiter voltage Vlimit. The limiter 120 maintains the limiter voltage Vlimit for voltages across the limiter 120 that exceed the limiter voltage Vlimit. This condition may occur during open circuit of the photovoltaic string 100, such as when the output lead 130 or the output lead 131 is not connected to another circuit, i.e., when the photovoltaic string 100 is open. In that case, the photovoltaic string 100 will generate its maximum possible output voltage, which is the open circuit voltage Voc. When that occurs, the limiter 120 will limit the voltage across the photovoltaic string 100 to the limiter voltage Vlimit, which as explained is lower than the open circuit voltage Voc. This advantageously reduces the maximum possible output voltage of the photovoltaic string 100, allowing more solar cells 115 to be added to the photovoltaic string 100 without increasing the maximum possible output voltage.

The limiter 120 allows forward current to flow from the positive terminal 122 to the negative terminal 121 as per the arrow 123 when the voltage across the limiter 120 exceeds a bypass voltage Vbypass. The bypass voltage Vbypass is a very low voltage compared to the limiter voltage Vlimit. For example, the bypass voltage Vbypass may be as low as 0.4V or the forward voltage drop of a Schottky or p-n junction diode.

In order to extract the maximum power from a photovoltaic system, the impacts of electrical mismatching must be minimized. This electrical mismatch can arise from factors such as performance inconsistencies or shading that may cause the operating voltage of an inflicted photovoltaic module to be reduced in order to accommodate the photovoltaic string current. In the worst case, the inflicted photovoltaic module (or strings of solar cells therein) can be forced into reverse bias, which can result in severe heating, performance degradation, and reliability issues. To mitigate these effects, the limiter 120 allows forward current to pass through it beyond the voltage Vbypass so that when the photovoltaic string 100 enters reverse bias, the limiter 120 shunts the current and limits the power consumption of the inflicted photovoltaic module 114.

Bypass diodes are commonly used in photovoltaic modules to protect individual substrings within a photovoltaic module or the entire photovoltaic module during the aforementioned electrical mismatch conditions. For example, Schottky and p-n junction diodes have been used as bypass diodes. Schottky diodes typically have lower forward voltages than p-n junction diodes, so they dissipate lower power and operate at lower temperatures when in forward bias, i.e., bypass mode; however, they exhibit higher leakage currents and have limited reverse breakdown voltage capabilities. On the other hand, p-n junction diodes show very low leakage currents and can be designed to breakdown at much higher voltages, making them appropriate as bypass diodes across photovoltaic strings containing more cells. However, bypass diodes in general do not conduct current nor present a sufficiently high voltage in the reverse direction, making them inappropriate for use as an open circuit voltage limiter.

Figure 2:
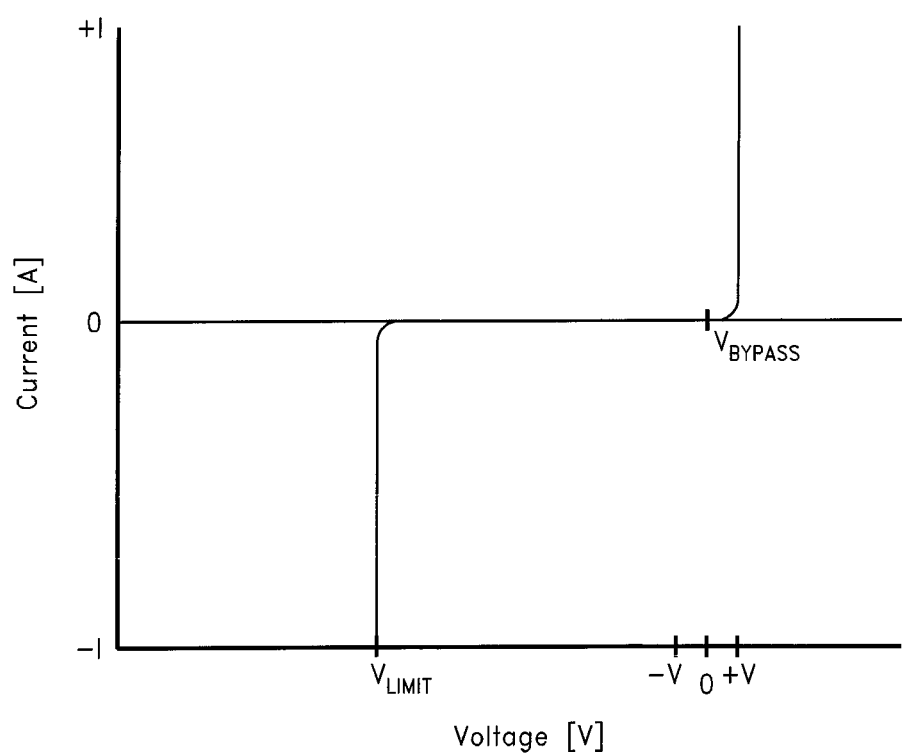
FIG. 2 shows an ideal I-V curve of the open circuit voltage limiter of FIG. 1 in accordance with an embodiment of the present invention.

FIG. 2 shows an ideal I-V curve of the open circuit voltage limiter 120 in accordance with an embodiment of the present invention. The I-V curve of FIG. 2 shows the current through the limiter 120 as a function of voltage across the limiter 120. As shown in FIG. 2, with a forward current, the limiter 120 does not conduct current until after a positive bypass voltage Vbypass, which may be a couple of volts, e.g., 0.4V. With a reverse current, the limiter 120 ideally does not conduct current until the magnitude of the voltage across the limiter 120 exceeds the magnitude of the limiter voltage Vlimit. As shown in FIG. 2, the limiter 120 limits the magnitude of the voltage across the limiter 120 to the limiter voltage Vlimit with current going in the reverse direction, i.e., current flowing from the negative terminal 121 to the positive terminal 122 as per the arrow 124 (see FIG. 1). The limiter voltage Vlimit is a negative voltage in the example of FIG. 2 because the current is going through the limiter 120 in the reverse direction. The limiter 120 limits the voltage across the limiter 120 to the bypass voltage Vbypass with current going in the forward direction, i.e., current flowing from the positive terminal 122 to the negative terminal 121 as per the arrow 123 (see FIG. 1).

Figure 3:
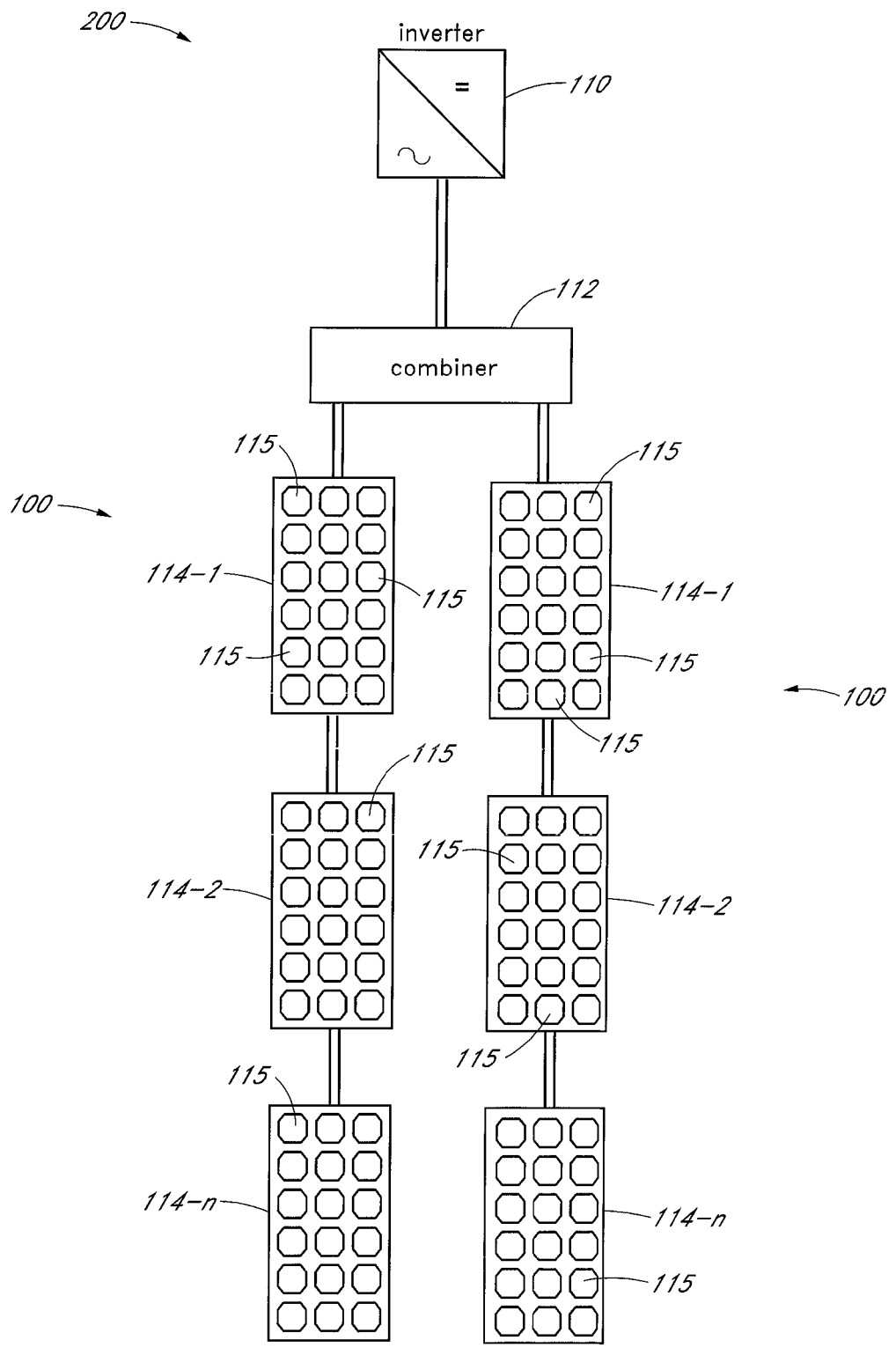
FIG. 3 schematically shows components of a photovoltaic system with the photovoltaic string of FIG. 1 in accordance with an embodiment of the present invention.

FIG. 3 schematically shows components of the photovoltaic system 200 in accordance with an embodiment of the present invention. The photovoltaic system components shown in the example of FIG. 3 include a combiner box 112, a plurality of photovoltaic panels 114, and a photovoltaic inverter 110. A photovoltaic system may include a plurality of photovoltaic inverters and combiner boxes but only one of each is shown in FIG. 3 for clarity of illustration. Also, the photovoltaic system 200 may include one, two, or more photovoltaic strings 100. A combiner box 112 provides junctions where the photovoltaic modules 114 may be combined in parallel and/or connected to other components. An open circuit voltage limiter 120 may be installed across a photovoltaic string 100 in the combiner box 112. The outputs of the photovoltaic strings 100 are electrically connected to the photovoltaic inverter 110, which converts direct current (DC) generated by the solar cells 115 to alternating current (AC) suitable for delivery to a utility power grid, for example. Only some of the solar cells 115 are labeled in FIG. 3 for clarity of illustration.

Figure 4:
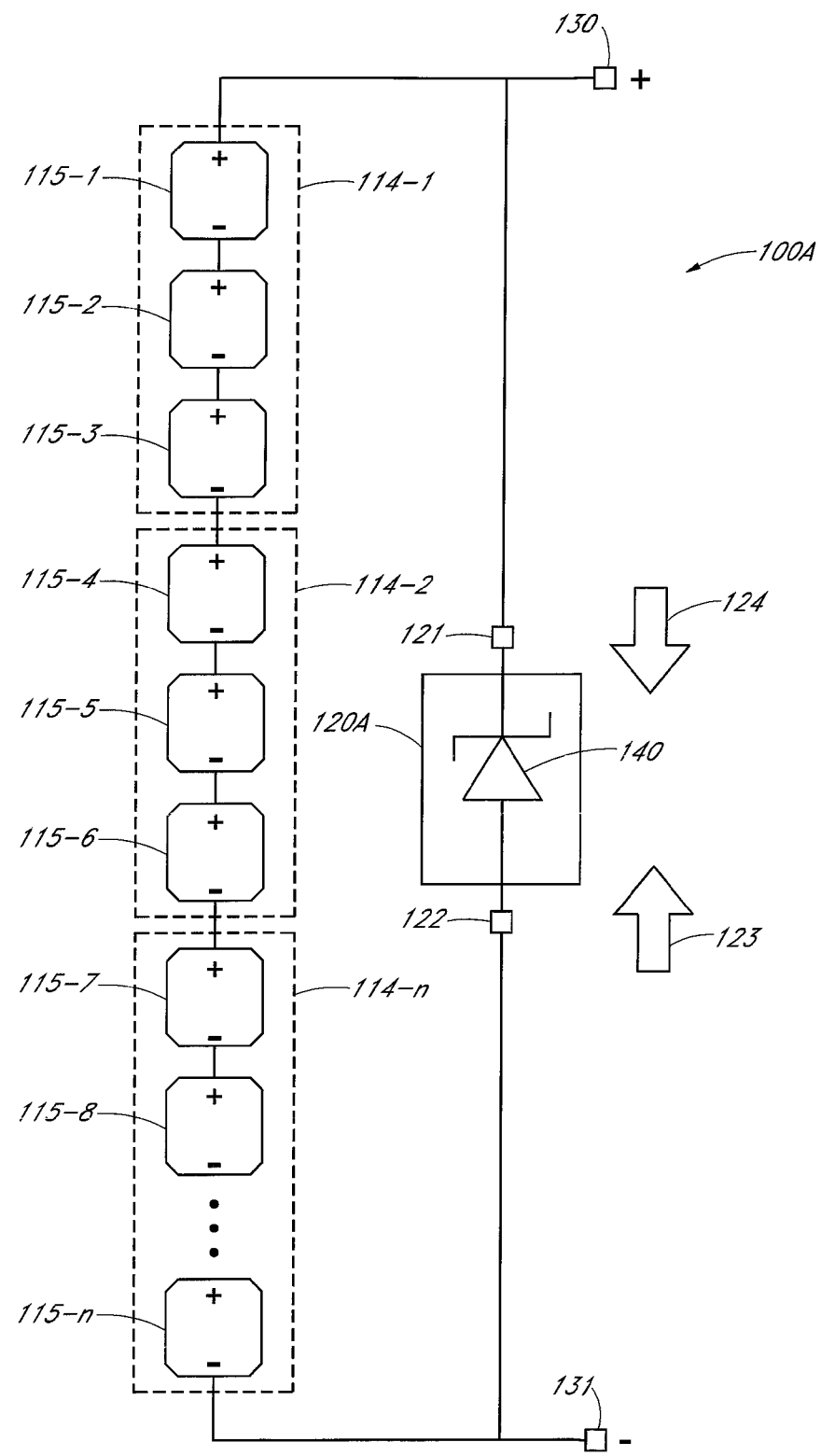
FIG. 4 shows a schematic diagram of a photovoltaic string in accordance with another embodiment of the present invention.

FIG. 4 shows a schematic diagram of a photovoltaic string 100A in accordance with an embodiment of the present invention. The photovoltaic string 100A is the same as the photovoltaic string 100 except for the use of an open circuit voltage limiter 120A. The components of the photovoltaic string 100A are otherwise the same as explained with reference to FIG. 1.

In the example of FIG. 4, the open circuit voltage limiter 120A is a particular embodiment of the open circuit voltage limiter 120. The open circuit voltage limiter 120A has the same I-V curve and electrical characteristics, including the negative terminal 121 and the positive terminal 122. In the example of FIG. 4, the open circuit voltage limiter 120A comprises a Zener diode 140. The cathode of the Zener diode 140 is connected to the negative terminal 121, and the anode of the Zener diode 140 is connected to the positive terminal 122. This electrically connects the cathode of the Zener diode 140 to the positive output lead 130 of the photovoltaic string 100A, and the anode of the Zener diode 140 to the negative output lead 131 of the photovoltaic string 100A.

Generally speaking, a Zener diode is a particular type of diode that is specifically designed to operate in reverse breakdown mode. This enables it to conduct current in both the forward and reverse bias directions. The Zener voltage is the voltage at which the Zener diode begins to pass current in the reverse direction. The Zener voltage is negative and is typically much higher in absolute magnitude than the forward voltage of the Zener diode. Because Zener diodes exhibit forward bias characteristics that are very similar to standard diodes, they can also be used in bypass applications. In the example of FIG. 4, this allows the Zener diode 140 to be used as a voltage limiter and as a bypass diode to protect against electrical mismatch.

Figure 5:
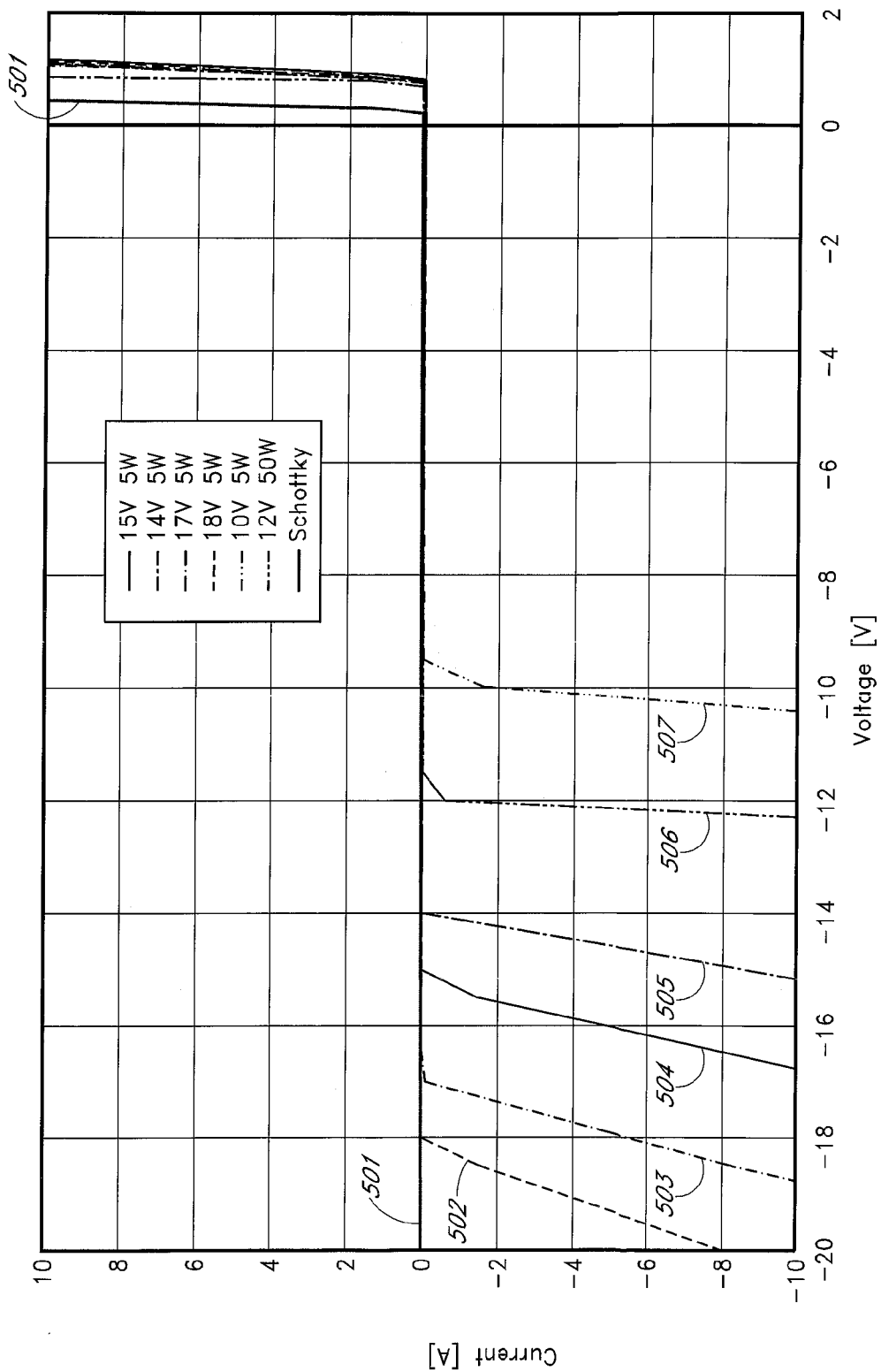
FIG. 5 shows I-V curves for several different Zener diodes in one experiment.

FIG. 5 shows I-V curves for several different Zener diodes in one experiment. In the example of FIG. 5, the I-V curve 502 is for a Zener diode with an 18V Zener voltage, the I-V curve 503 is for a Zener diode with a 17V Zener voltage, the I-V curve 504 is for a Zener diode with a 15V Zener voltage, the I-V curve 505 is for a Zener diode with a 14V Zener voltage, the I-V curve 506 is for a Zener diode with a 12V Zener voltage, and the I-V curve 507 is for a Zener diode with a 10V Zener voltage. All of the aforementioned Zener diodes have axial packages and are rated for 5 Watts except for the 12V Zener diode, which has a stud mount package and is rated for 50 W. The resistive slope of 12V Zener diode (see 506) is significantly steeper than the other devices due to the lower package resistance. FIG. 5 also shows an I-V curve 501 of a Schottky diode for comparison. As shown in FIG. 5, the Zener diodes begin to conduct current in the negative voltage direction once the Zener voltage is exceeded. The forward bias characteristics of the Zener diodes are similar to a conventional Schottky or p-n junction diode. The Schottky diode does not conduct current in the negative voltage direction (see 501) until a much larger reverse voltage is reached (e.g., 40V).

By connecting the anode of the Zener diode 140 to the negative output lead 131 and the cathode of the Zener diode 140 to the positive output lead 130 as in FIG. 4, the photovoltaic string 100A is prevented from operating at voltages higher than the Zener voltage, which is the limiter voltage Vlimit in this case. At the Zener voltage, the Zener diode 140 begins to pass current, effectively shunting the photovoltaic string 100A and pinning the photovoltaic string 100A at the Zener voltage. In one embodiment, the Zener voltage is selected to be between the nominal maximum power point voltage Vmp and the open circuit voltage Voc of the photovoltaic string 100A as per EQ. 1, advantageously allowing the maximum possible output voltage of the photovoltaic string 100A to be limited to the limiter voltage Vlimit without impacting the power output of the photovoltaic string 100A. The open circuit voltage limiter 120A with its Zener diode 140 thus modifies the I-V curve characteristics of the photovoltaic string 100A between the maximum power point voltage Vmp and the open circuit voltage Voc.

Figure 6:
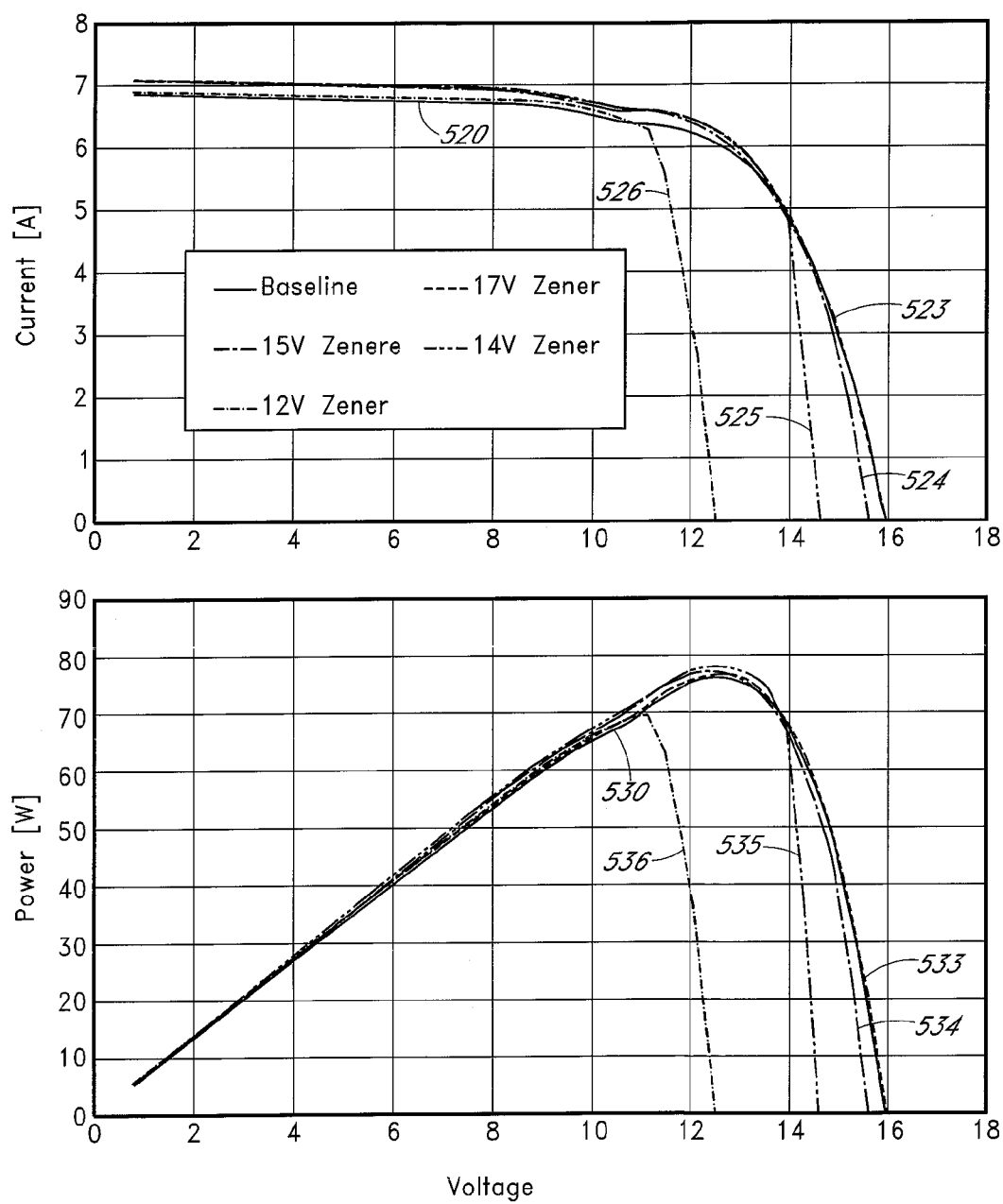
FIG. 6 shows example I-V curves and power-voltage curves of a photovoltaic string in one experiment.

FIG. 6 shows example I-V curves (upper graph) and power-voltage curves (lower graph) of a photovoltaic string 100A with a single low concentration photovoltaic (LCPV) receiver module having 24 solar cells in one experiment. In the example of FIG. 6, the I-V curve 523 is for a Zener diode 140 with a 17V Zener voltage, the I-V curve 524 is for a Zener diode 140 with a 15V Zener voltage, the I-V curve 525 is for a Zener diode 140 with a 14V Zener voltage, and the I-V curve 526 is for a Zener diode 140 with a 12V Zener voltage. The I-V curve 520 is for a photovoltaic string 100A without the limiter 120A and is presented as a baseline. As shown in the I-V curves of FIG. 6, the addition of the limiter 120A comprising the Zener diode 140 modifies the I-V curve of the photovoltaic string 100A, allowing for reducing the maximum possible voltage output of the photovoltaic string 100A from the open circuit voltage of the baseline to the Zener voltage of the Zener diode 140.

FIG. 6 also shows example power-voltage curves (lower graph) of the photovoltaic string 100A with the single 24-cell low concentration photovoltaic (LCPV) receiver module. The power-voltage curve 533 is for the Zener diode 140 with the 17V Zener voltage, the power-voltage curve 534 is for the Zener diode 140 with the 15V Zener voltage, the power-voltage curve 535 is for the Zener diode 140 with the 14V Zener voltage, and the power-voltage curve 536 is for the Zener diode 140 with the 12V Zener voltage. The power-voltage curve 530 is for the baseline configuration with no limiter 120A. In the I-V curves of FIG. 6, a larger portion of the I-V curve is clipped and the open circuit voltage Voc of the photovoltaic string 100A converges to the maximum power point voltage Vlimit as the Zener voltage is progressively decreased from the open circuit voltage Voc of the photovoltaic string 100A. In the case of the Zener diode with the 12V Zener voltage (see 536), the Zener voltage falls below Vmp, resulting in the power output of the string being reduced.

Generally speaking, there is limited value in operating between the maximum power point voltage Vmp and the open circuit voltage Voc because the power output is significantly lower than in the maximum power point. The open circuit voltage limiting described herein, however, reduces the open circuit voltage Voc (and hence increases the fill factor) of the photovoltaic string and allows for more system design optimization based on a lower peak voltage. If the Zener voltage is exceeded, the Zener diode 140 acts as a load and receives the current that would otherwise be flowing from the photovoltaic string 100A string to the output leads 130 and 131.

The Zener voltage can be tuned to almost any value from a few volts to several hundred volts, and as such, Zener diodes can be used to limit the voltage across strings of solar cells of varying lengths. One factor to consider when using Zener diodes as an open circuit voltage limiter is the power dissipation that occurs in Zener breakdown mode. The power is directly proportional to the Zener voltage, and this can become prohibitively high if the shunted current is high. As the voltage limiting is increased and the Zener voltage is reduced from the open circuit voltage Voc to the maximum power point voltage Vmp, the power dissipation by the Zener diode increases. This trade-off must be balanced in the circuit design, and the thermal load may be appropriately managed by using heat spreaders, heat sinks, and other passive or active heat management solutions.

In the example of FIG. 4, the Zener diode 140 is connected across an entire photovoltaic string. In another embodiment, a Zener diode may be connected across only one or a few solar cells, reducing the Zener voltage necessary for the limiting effect. In this case, multiple Zener diodes may be connected within the laminate of a photovoltaic module, or specific solar cells or groups of solar cells may be selected for voltage regulation. For example, in a linear LCPV receiver containing a linear series of solar cells, Zener diodes may be connected across pairs of solar cells via the interconnects. This approach enables more flexibility in the design because the overall photovoltaic string limiting voltage may be adjusted not just by the Zener voltage but also by the number of Zener diodes. This approach may be enhanced by connecting a string-level bypass diode in parallel to deal with electrical mismatch. In yet another embodiment, the Zener diode may be implemented at the system level, limiting the voltage of a series of modules.

Figure 7:
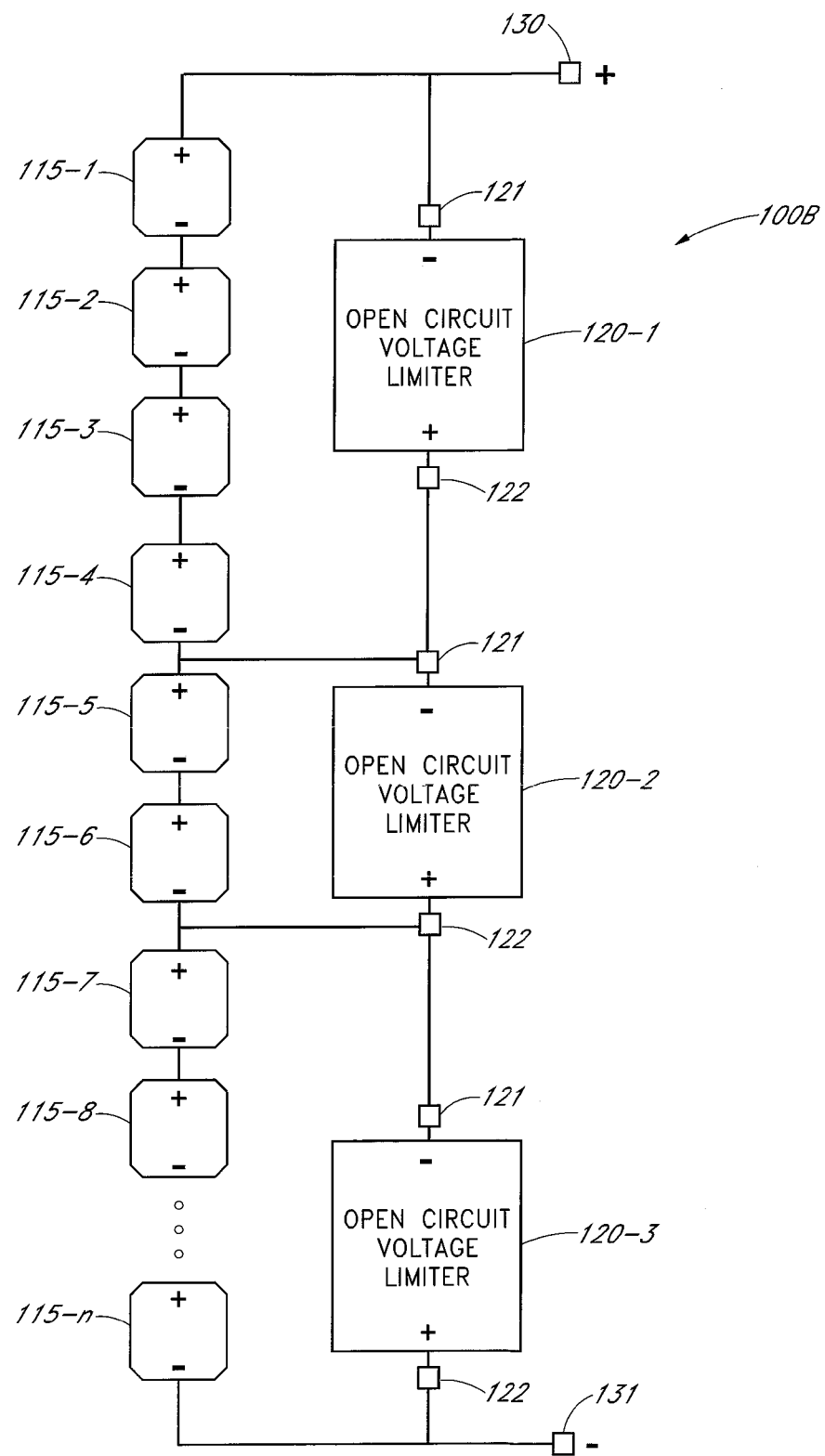
FIG. 7 shows a schematic diagram of a photovoltaic string in accordance with another embodiment of the present invention.

The open circuit voltage limiter 120 may be incorporated in a photovoltaic string 100 in a variety of configurations. FIG. 7 shows a schematic diagram of a photovoltaic string 100B in accordance with an embodiment of the present invention. The photovoltaic string 100B is a particular embodiment of the photovoltaic string 100 of FIG. 1 where multiple open circuit voltage limiters 120 (i.e., 120-1, 120-2, and 120-3) are employed to limit the maximum possible voltage across particular groups of solar cells 115 to cover the entire photovoltaic string 100B. By having open circuit voltage limiters 120 across the photovoltaic string 100B, the limiter voltage Vlimit requirement, and hence power dissipation, of any particular open circuit voltage limiter 120 may be reduced.

In the example of FIG. 7, an open circuit voltage limiter 120-1 limits the maximum possible voltage across the solar cells 115-1, 115-2, 115-3, and 115-4; an open circuit voltage limiter 120-2 limits the maximum possible voltage across the solar cells 115-5 and 115-6; and an open circuit voltage limiter 120-3 limits the maximum possible voltage across the solar cells 115-7, 115-8, ..., and 115-n. The negative terminal 121 of the open circuit voltage limiter 120-1 is connected to the positive output lead 130, the negative terminal 121 of the open circuit voltage limiter 120-2 is connected to the positive terminal 122 of the open circuit voltage limiter 120-1, the negative terminal 121 of the open circuit voltage limiter 120-3 is connected to the positive terminal 122 of the open circuit voltage limiter 120-2, and the positive terminal 122 of the open circuit voltage limiter 120-3 is connected to the negative output lead 131. The overall limiter voltage Vlimit across the entire photovoltaic string 100B has been distributed among multiple open circuit voltage limiters 120, allowing individual open circuit voltage limiters 120 to have a reduced limiter voltage Vlimit, and hence a lower power dissipation in voltage limiting mode, compared to having a single open circuit voltage limiter 120 cover the entire photovoltaic string 100B.

Figure 8:
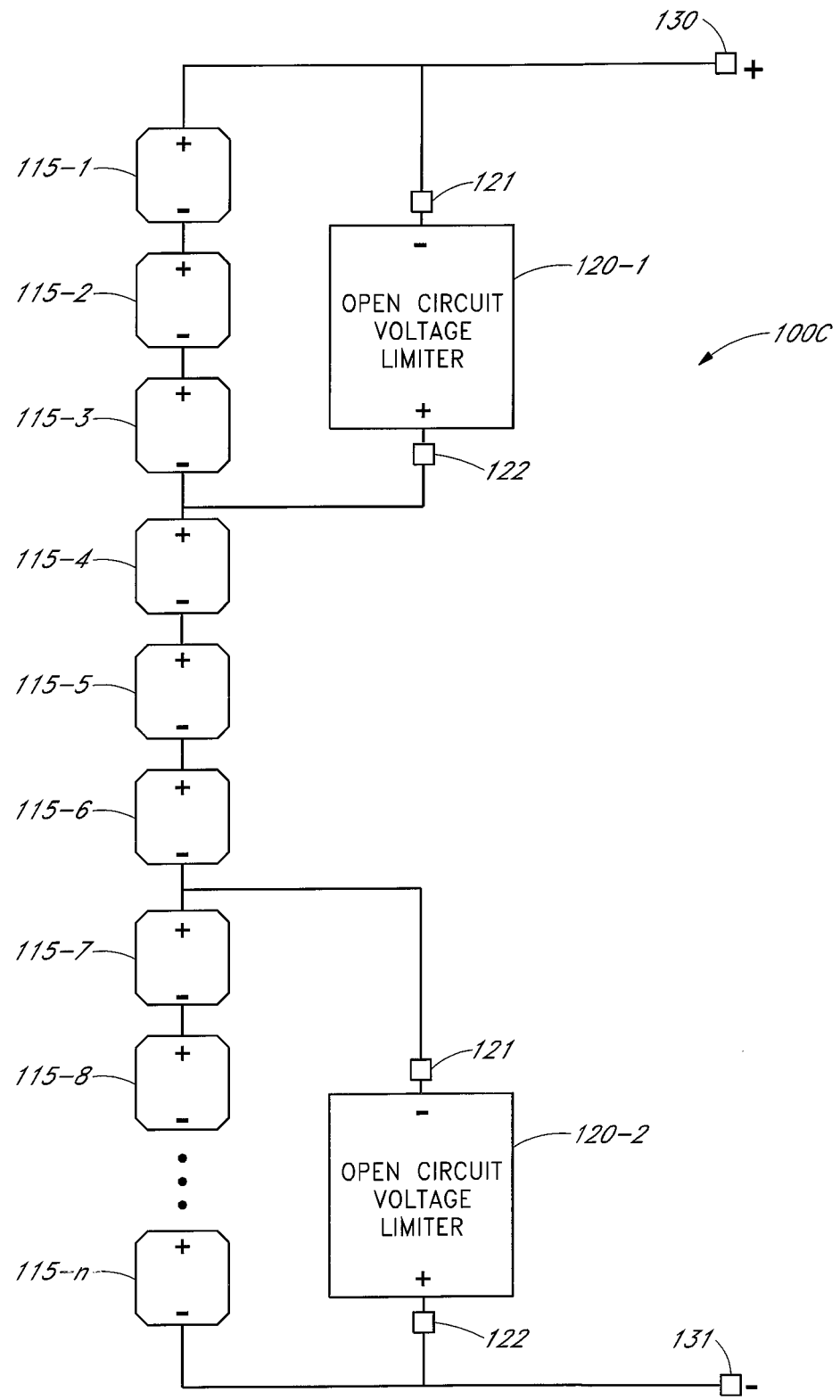
FIG. 8 shows a schematic diagram of a photovoltaic string in accordance with another embodiment of the present invention.

FIG. 8 shows a schematic diagram of a photovoltaic string 100C in accordance with an embodiment of the present invention. The photovoltaic string 100C is a particular embodiment of the photovoltaic string 100 of FIG. 1 where one or more open circuit voltage limiters 120 are employed across only some, but not all, groups of solar cells in the photovoltaic string 100C. This allows for more design options in that the open circuit voltage Voc across the entire photovoltaic string 100C may be limited by the number of open circuit voltage limiters 120 employed and the number of solar cells 115 limited by individual open circuit voltage limiters 120.

In the example of FIG. 8, the open circuit voltage limiter 120-1 limits the maximum possible voltage across the solar cells 115-1, 115-2, and 115-3, and the open circuit voltage limiter 120-2 limits the maximum possible voltage across the solar cells 115-7, 115-8, and 115-n. The maximum possible voltage across the solar cells 115-4, 115-5, and 115-6 is not limited. However, the overall maximum possible voltage across the photovoltaic string 100C, i.e., between the output leads 130 and 131, is reduced by the limiters 120-1 and 120-2.

Figure 9:
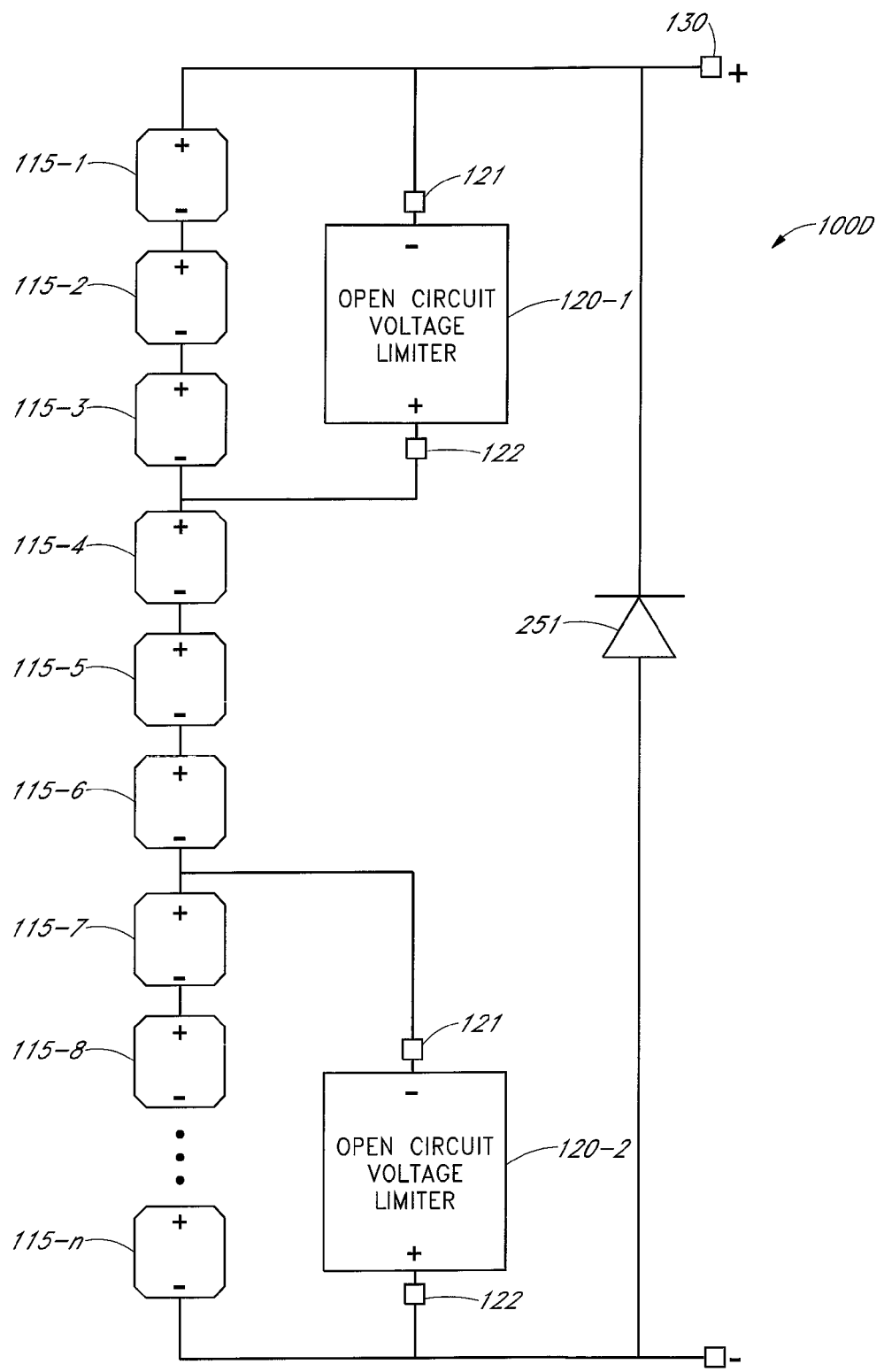
FIG. 9 shows a schematic diagram of a photovoltaic string in accordance with another embodiment of the present invention.

Providing open circuit voltage limiting across the entire photovoltaic string, as in the photovoltaic strings 100, 100A, and 100B, advantageously allows conduction of forward current through the one or more limiters 120, thereby providing bypass protection in the event of electrical mismatch. The photovoltaic string 100C of FIG. 8 does not have bypass protection but may include a bypass diode as in the photovoltaic string 100D of FIG. 9. The photovoltaic string 100D is a particular embodiment of the photovoltaic string 100C with the addition of a bypass diode 251. The bypass diode 251 provides protection against electrical mismatch by allowing forward current conduction to shunt the photovoltaic string 100D. The bypass diode 251 may comprise a Schottky or p-n junction diode. The photovoltaic string 100D is otherwise the same as the photovoltaic string 100C.

As can be appreciated, an open circuit voltage limiter 120 may be implemented as an electrical circuit and using devices other than Zener diodes. Other devices that may be employed include metal oxide varistors (MOVs), transistors (MOSFETs or BJTs), opposing parallel diodes with specifically tuned forward voltages, thyristors, etc. by themselves and/or in combination with other devices to form an electrical circuit, e.g., an electrical circuit comprising transistors. Basically, any device or circuit that is capable of shunting current beyond a specific threshold voltage in one bias direction and a different threshold voltage in the other bias direction may be used to achieve the open circuit voltage limiter functionality.

Figure 10:
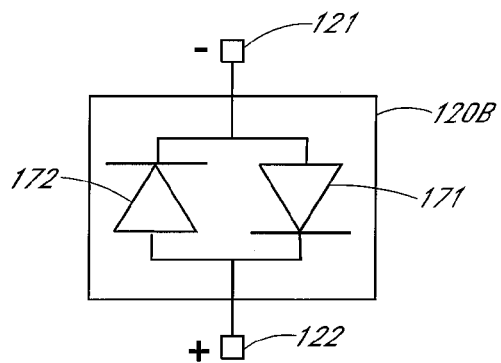
FIG. 10 shows an open circuit voltage limiter in accordance with another embodiment of the present invention.

FIG. 10 shows an open circuit voltage limiter 120B in accordance with an embodiment of the present invention. The open circuit voltage limiter 120B is a particular embodiment of and works in the same fashion as the open circuit voltage limiter 120. Accordingly, like the open circuit voltage limiter 120A of FIG. 4, the open circuit voltage limiter 120B may be employed in the photovoltaic strings 100, 100A, 100B, 100C, 100D, and other photovoltaic strings as an open circuit voltage limiter.

In the example of FIG. 10, the open circuit voltage limiter 120B comprises a forward diode 172 and a reverse diode 171. The cathode of the forward diode 172 is connected to the negative terminal 121 and the anode of the forward diode 172 is connected to the positive terminal 122. The cathode of the reverse diode 171 is connected to the positive terminal 122 and the anode of the reverse diode 171 is connected to the negative terminal 121.

The diodes 171 and 172 may comprise Schottky or p-n junction diodes, and accordingly conduct current only in one direction. However, in the example of FIG. 10, the diodes 171 and 172 are in anti-parallel configuration with one diode being arranged to flow current in one direction and the other diode being arranged to flow current in the opposite direction. This allows the open circuit voltage limiter 120B to flow current in both directions. By appropriate design of the forward characteristics of the diodes 171 and 172, the voltage beyond which the diodes 171 and 172 conduct current may be optimized.

For example, the forward voltage drop of the forward diode 172 may be designed to be as low as possible because it is used in bypass mode. In that example, the forward voltage drop of the reverse diode 171 may be designed to provide a limiter voltage Vlimit that is higher than the maximum power point voltage Vmp but less than the open circuit voltage Voc as in EQ. 1. During open circuit voltage conditions, current will flow from the negative terminal 121, through the reverse diode 171, and to the positive terminal 122 when the voltage across the limiter 120B exceeds the limiter voltage Vlimit, which is across the reverse diode 171. Note that the forward diode 172 will not conduct current during open circuit voltage conditions because it will be reverse biased. In the event of an electrical mismatch, the forward diode 172 will be forward biased to shunt current away from the photovoltaic string. The reverse diode 171 will be reverse biased at that time, and accordingly will not conduct current.

Figure 11:
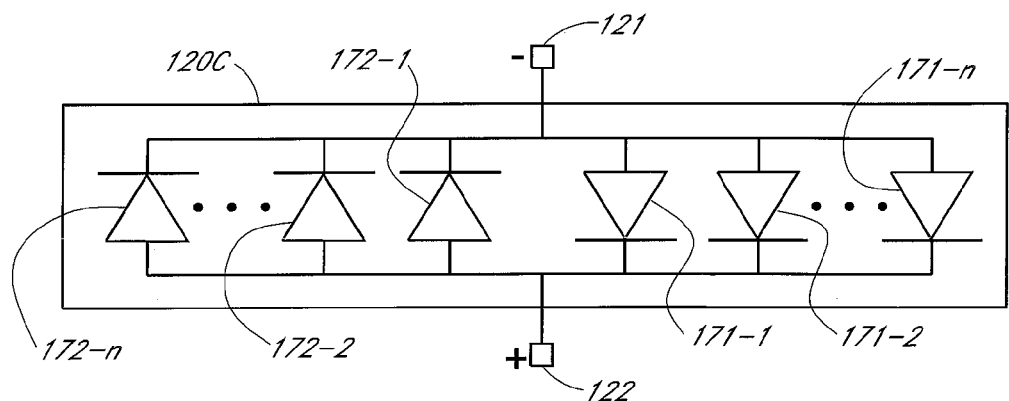
FIG. 11 shows an open circuit voltage limiter in accordance with another embodiment of the present invention.

FIG. 11 shows an open circuit voltage limiter 120C in accordance with an embodiment of the present invention. The open circuit voltage limiter 120C is a particular embodiment of and works in the same fashion as the open circuit voltage limiter 120. Accordingly, the limiter 120C may be employed in the photovoltaic strings 100, 100A, 100B, 100C, 100D, and other photovoltaic strings as an open circuit voltage limiter. The open circuit voltage limiter 120C is the same as the open circuit voltage limiter 120B except for the use of a plurality of forward diodes 172 (i.e., 172-1, 172-2, . . . , 172-n) and a plurality of reverse diodes 171 (i.e., 171-1, 171-2, . . . , 171-n). Using multiple forward diodes 172 and/or reverse diodes 171 allows for optimization of the forward voltage drop or current carrying capacity of the diodes in the open circuit voltage limiter 120C. The open circuit voltage limiter 120C is otherwise the same as the open circuit voltage limiter 120B.

Figure 12:
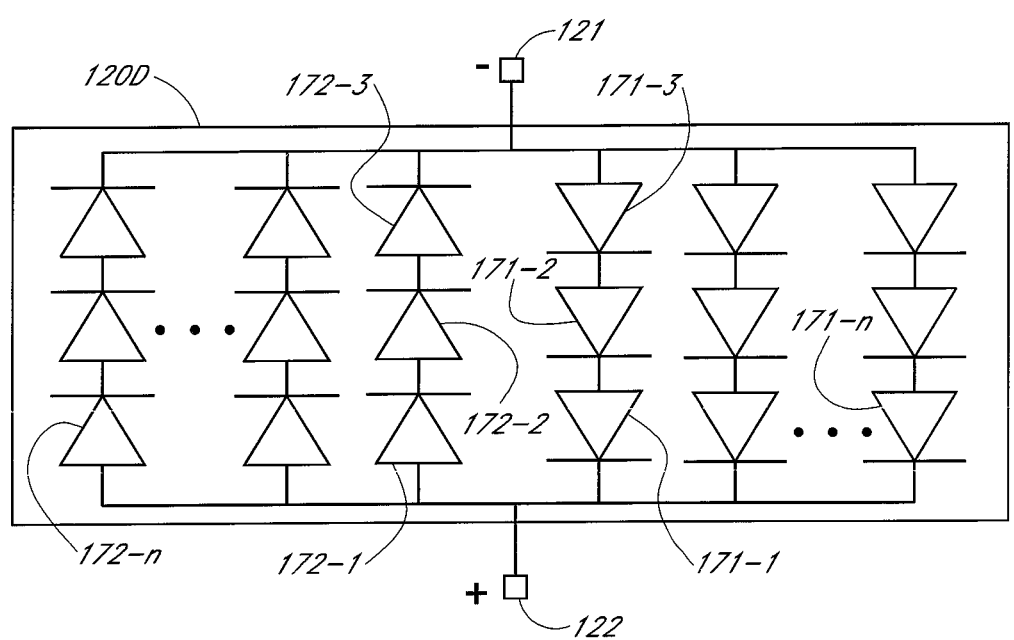
FIG. 12 shows an open circuit voltage limiter in accordance with another embodiment of the present invention.

FIG. 12 shows an open circuit voltage limiter 120D in accordance with an embodiment of the present invention. The open circuit voltage limiter 120D is a particular embodiment of and works in the same fashion as the open circuit voltage limiter 120. Accordingly, the limiter 120D may be employed in the photovoltaic strings 100, 100A, 100B, 100C, 100D, and other photovoltaic strings as an open circuit voltage limiter. The open circuit voltage limiter 120D is the same as the open circuit voltage limiter 120C except for the use of additional diodes in series with the forward diodes 172 and additional diodes in series with the reverse diodes 171. In particular, one or more diodes may be placed in series with a forward diode 172 and/or a reverse diode 171 to allow for further optimization of the forward voltage drop or current carrying capacity of the diodes in the open circuit voltage limiter 120D. The open circuit voltage limiter 120D is otherwise the same as the open circuit voltage limiter 120C.

Electrical circuits and methods for limiting the open circuit voltage of photovoltaic strings have been disclosed. Although specific embodiments of the present invention have been provided, it is to be understood that these embodiments are for illustration purposes and not limiting. Many additional embodiments will be apparent to persons of ordinary skill in the art reading this disclosure.

What is claimed is:

1. A photovoltaic string comprising:
    a plurality of serially connected solar cells;
    a positive lead and a negative lead on opposite ends of the photovoltaic string, one end of the plurality of serially connected solar cells being connected to the positive lead and an opposite end of the plurality of serially connected solar cells being connected to the negative lead;
    an open circuit voltage limiter across a group of solar cells in the plurality of serially connected solar cells, the open circuit voltage limiter having a positive terminal connected to the negative lead and a negative terminal connected to a connection between adjacent solar cells in the plurality of solar cells, the open circuit voltage limiter having a limiter voltage less than an open circuit voltage of the group of solar cells for current flowing through the open circuit voltage limiter in one direction and allows current flow through the open circuit voltage limiter in another direction; and
    a bypass diode having a cathode connected to the positive lead and an anode connected to the negative lead.

2. The photovoltaic string of claim 1 wherein the open circuit voltage limiter comprises a Zener diode and the limiter voltage is the Zener voltage of the Zener diode.

3. The photovoltaic string of claim 1 wherein the open circuit voltage limiter comprises:
    a first diode having a cathode connected to the positive terminal of the open circuit voltage limiter and an anode connected to the negative terminal of the open circuit voltage limiter; and
    a second diode having a cathode connected to the negative terminal of the open circuit voltage limiter and an anode connected to the positive terminal of the open circuit voltage limiter.

4. The photovoltaic string of claim 3 wherein the open circuit voltage limiter further comprises:
    a third diode having a cathode connected to the positive terminal of the open circuit voltage limiter and an anode connected to the negative terminal of the open circuit voltage limiter.

5. The photovoltaic string of claim 1 wherein the open circuit voltage limiter comprises an electrical circuit.

6. A photovoltaic string comprising:
    a plurality of serially connected solar cells;
    a first open circuit voltage limiter across a first group of solar cells in the plurality of serially connected solar cells, the first open circuit voltage limiter having a first limiter voltage less than a maximum voltage of the first group of solar cells for current flowing through the first open circuit voltage limiter in one direction and having a first positive bypass voltage for current flowing through the first open circuit voltage limiter in another direction; and
    a bypass diode connected across the plurality of serially connected solar cells.

7. The photovoltaic string of claim 6 wherein the first open circuit voltage limiter comprises a Zener diode and the limiter voltage comprises a Zener voltage of the Zener diode.

8. The photovoltaic string of claim 6 wherein the first open circuit voltage limiter comprises:
    a first diode having a cathode connected to a positive terminal of the first open circuit voltage limiter and an anode connected to a negative terminal of the first open circuit voltage limiter; and
    a second diode having a cathode connected to the negative terminal of the first open circuit voltage limiter and an anode connected to the positive terminal of the first open circuit voltage limiter.

9. The photovoltaic string of claim 8 wherein the first open circuit voltage limiter further comprises:
    a third diode having a cathode connected to the positive terminal of the first open circuit voltage limiter and an anode connected to the negative terminal of the first open circuit voltage limiter.

10. The photovoltaic string of claim 6 wherein the first open circuit voltage limiter comprises an electrical circuit.

11. The photovoltaic string of claim 6 further comprising:
    a second open circuit voltage limiter across a second group of solar cells in the plurality of serially connected solar cells, the second open circuit voltage limiter having a second limiter voltage less than a maximum voltage of the second group of solar cells for current flowing through the second open circuit voltage limiter in one direction and having a second positive bypass voltage for current flowing through the second open circuit voltage limiter in another direction.

12. A method of operating a photovoltaic string, the method comprising:
    providing a first open circuit voltage limiter across a first group of serially connected solar cells of the photovoltaic string;
    providing a bypass diode across the photovoltaic string;
    limiting a maximum voltage across the first group of serially connected solar cells to a first limiter voltage across the first open circuit voltage limiter for current flowing in a first direction through the first open circuit voltage limiter; and
    allowing current to flow through the first open circuit voltage limiter in a second direction opposite the first direction.

13. The method of claim 12 further comprising:
    limiting a maximum voltage across a second group of serially connected solar cells to a second limiter voltage across a second open circuit voltage limiter for current flowing in a third direction through the second open circuit voltage limiter, the second group of serially connected solar cells being connected in series with the first group of serially connected solar cells; and
    allowing current to flow through the first open circuit voltage limiter in a fourth direction opposite the third direction.

* * * * *